(12) United States Patent
Poddar et al.

(10) Patent No.: US 12,160,219 B2
(45) Date of Patent: Dec. 3, 2024

(54) METAL RIBS IN ELECTROMECHANICAL DEVICES

(71) Applicant: TEXAS INSTRUMENTS INCORPORATED, Dallas, TX (US)

(72) Inventors: Anindya Poddar, Sunnyvale, CA (US); Hau Nguyen, San Jose, CA (US); Masamitsu Matsuura, Beppu (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/454,034

(22) Filed: Aug. 22, 2023

(65) Prior Publication Data
US 2023/0396230 A1 Dec. 7, 2023

Related U.S. Application Data

(63) Continuation of application No. 17/002,357, filed on Aug. 25, 2020, now Pat. No. 11,736,085.

(51) Int. Cl.
| | |
|---|---|
| *H03H 9/02* | (2006.01) |
| *H03H 3/007* | (2006.01) |
| *H03H 3/04* | (2006.01) |
| *H03H 9/05* | (2006.01) |
| *H03H 9/10* | (2006.01) |
| *H03H 9/17* | (2006.01) |
| *H03H 9/24* | (2006.01) |

(52) U.S. Cl.
CPC ...... *H03H 9/02133* (2013.01); *H03H 3/0073* (2013.01); *H03H 3/04* (2013.01); *H03H 9/02102* (2013.01); *H03H 9/02448* (2013.01); *H03H 9/0523* (2013.01); *H03H 9/0533* (2013.01); *H03H 9/0547* (2013.01); *H03H 9/1021* (2013.01); *H03H 9/1057* (2013.01); *H03H 9/17* (2013.01); *H03H 9/2426* (2013.01); *H03H 9/2457* (2013.01); *H03H 2003/0407* (2013.01)

(58) Field of Classification Search
CPC .......... H03H 9/02133; H03H 9/02102; H03H 9/02448; H03H 9/0523; H03H 9/0533; H03H 9/0547; H03H 9/1021; H03H 9/1057; H03H 9/17; H03H 9/2426; H03H 9/2457; H03H 9/1014; H03H 3/0073; H03H 3/04; H03H 3/02; H03H 2003/0407
See application file for complete search history.

(56) References Cited

U.S. PATENT DOCUMENTS

| | | | | |
|---|---|---|---|---|
| 11,736,085 | B2 * | 8/2023 | Poddar | H03H 9/2426 257/416 |
| 2015/0280688 | A1 | 10/2015 | Ortiz et al. | |
| 2021/0028766 | A1 | 1/2021 | Hurwitz et al. | |

* cited by examiner

*Primary Examiner* — Jeffrey M Shin
(74) *Attorney, Agent, or Firm* — Dawn Jos; Frank D. Cimino

(57) ABSTRACT

In examples, a device comprises a semiconductor die, a thin-film layer, and an air cavity positioned between the semiconductor die and the thin-film layer. The air cavity comprises a resonator positioned on the semiconductor die. A rib couples to a surface of the thin-film layer opposite the air cavity.

28 Claims, 20 Drawing Sheets

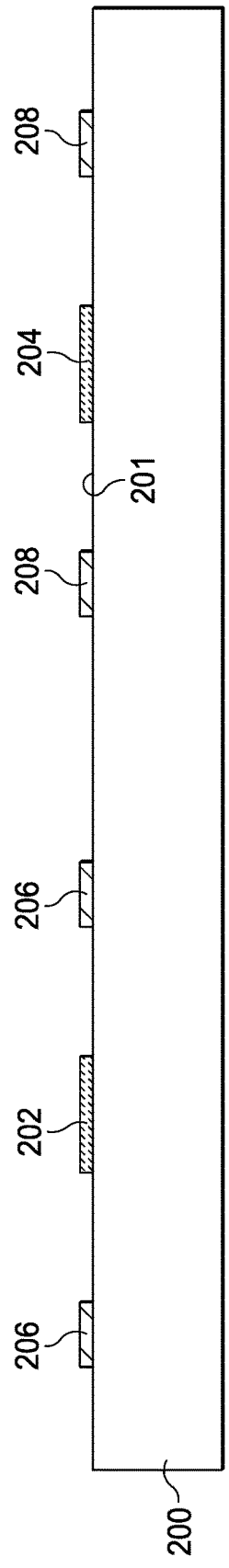
FIG. 2A1
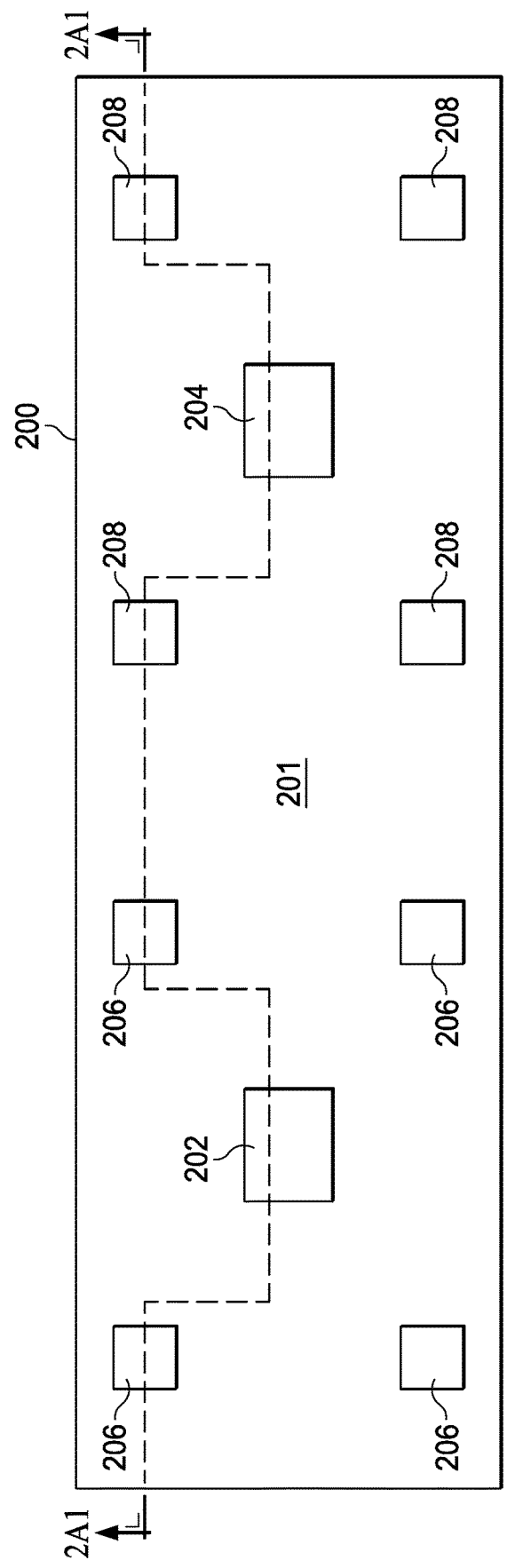
FIG. 2A2

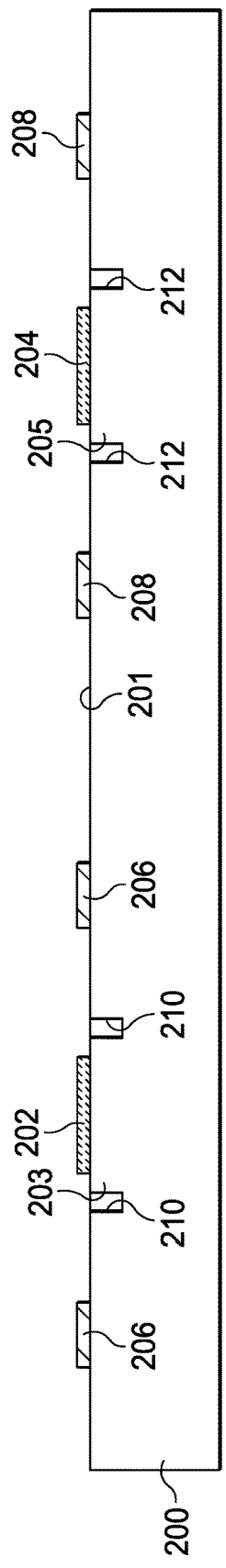
FIG. 2B1
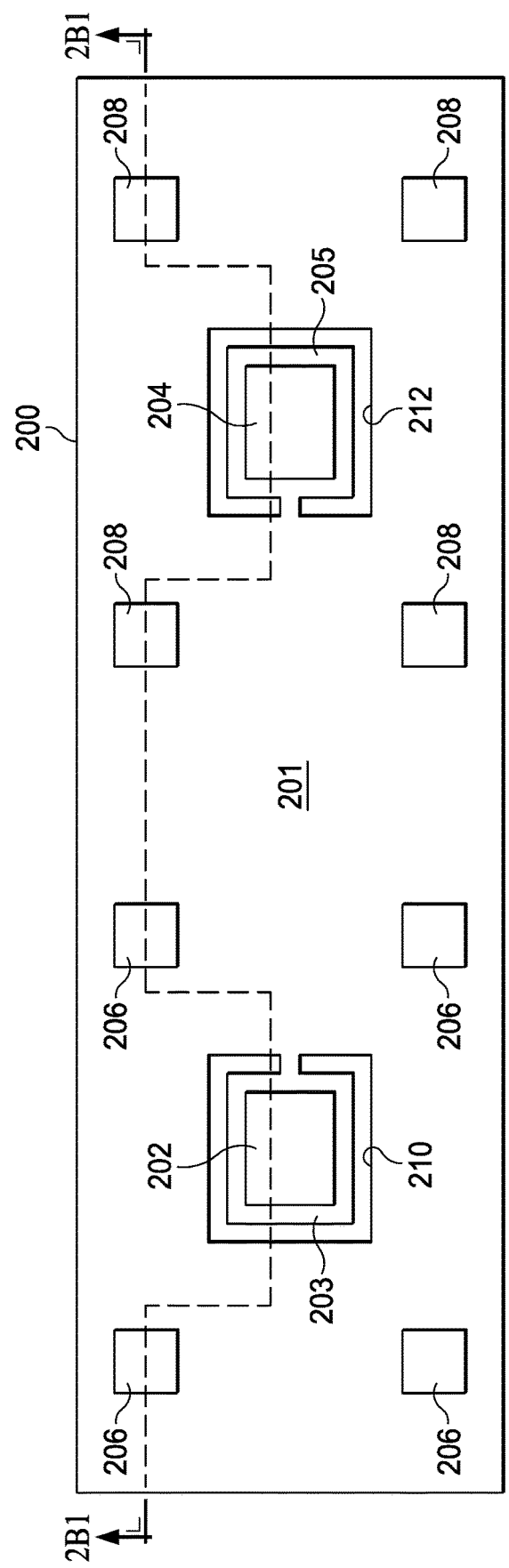
FIG. 2B2

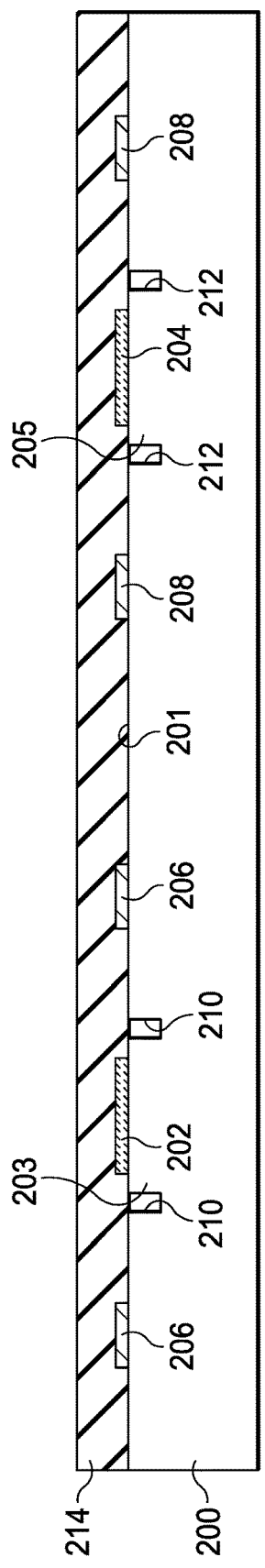
FIG. 2C1
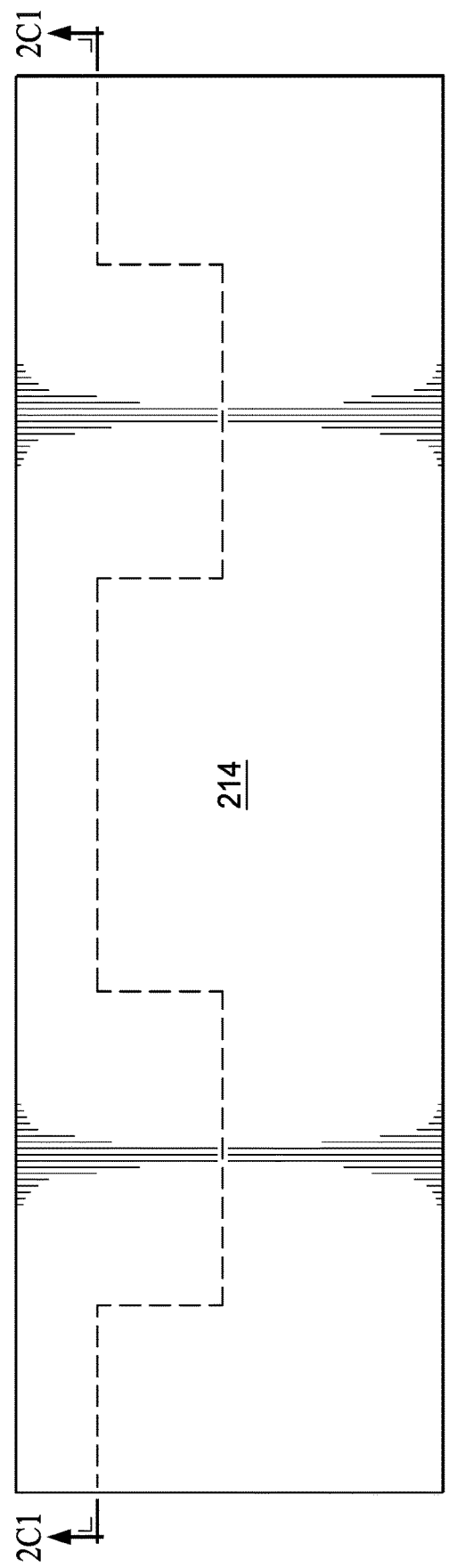
FIG. 2C2

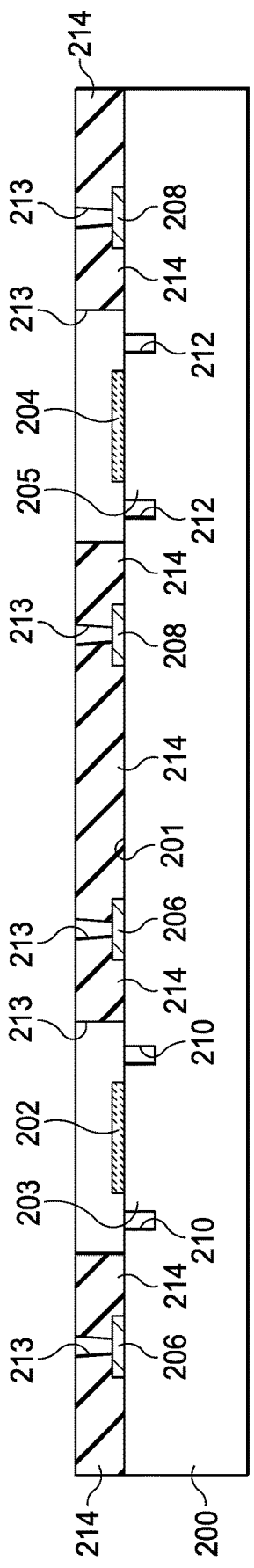
FIG. 2D1
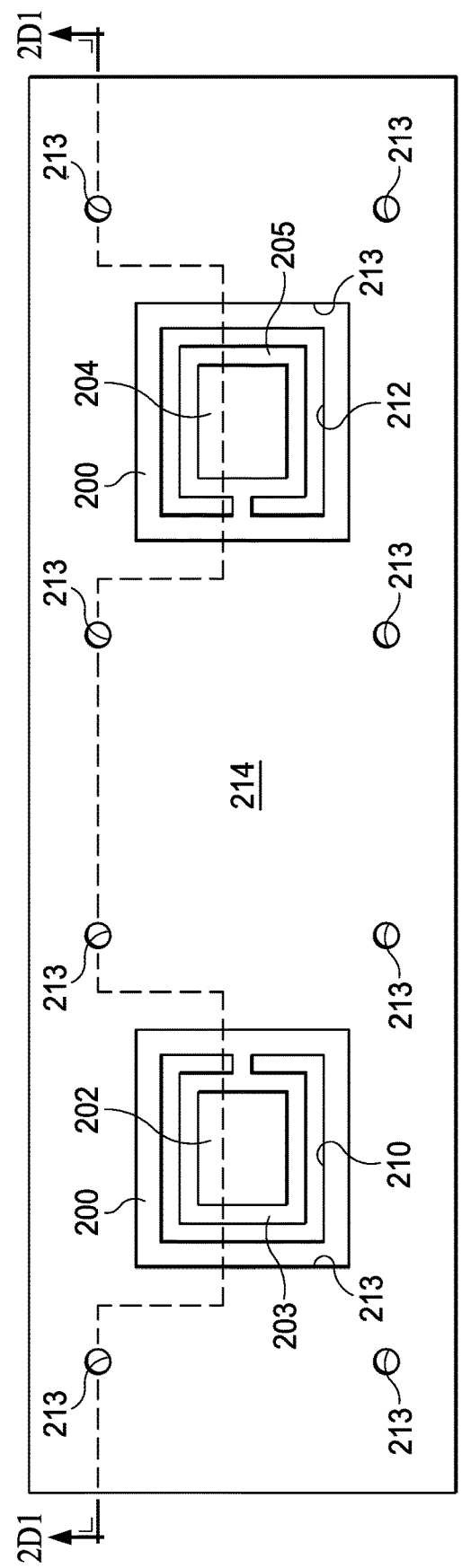
FIG. 2D2

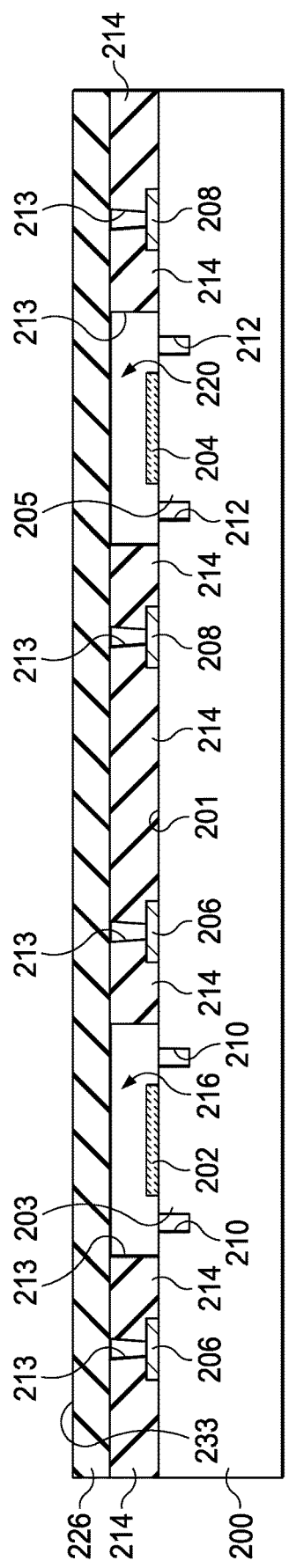
FIG. 2E1
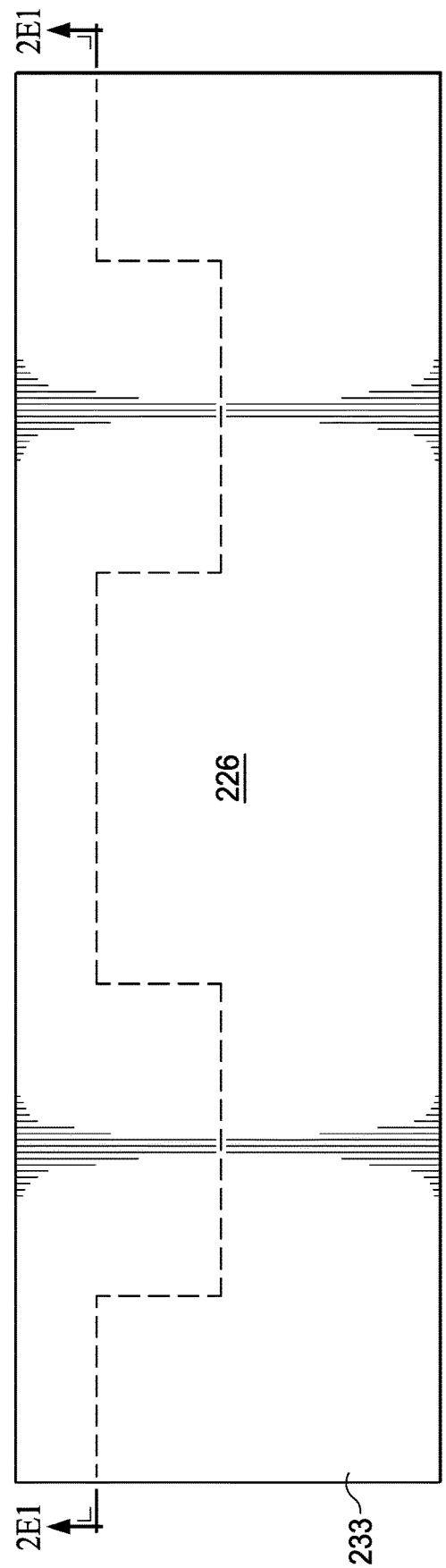
FIG. 2E2

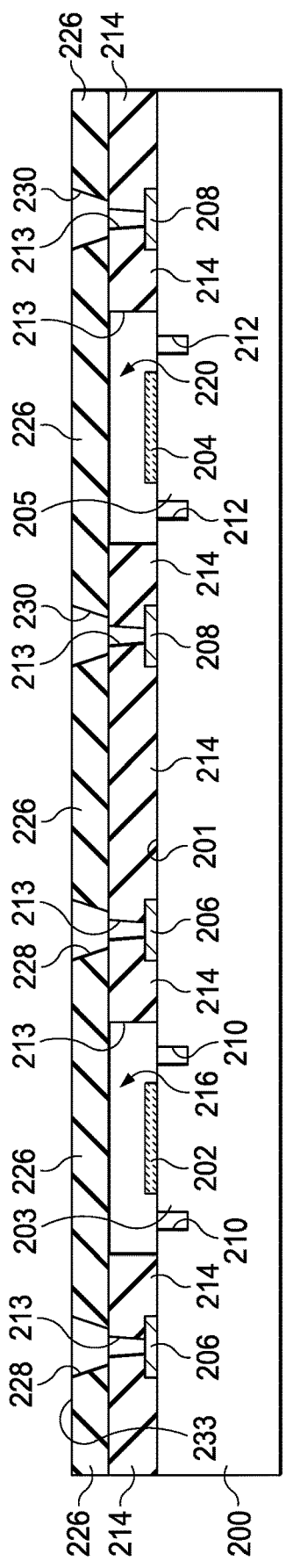
FIG. 2F1
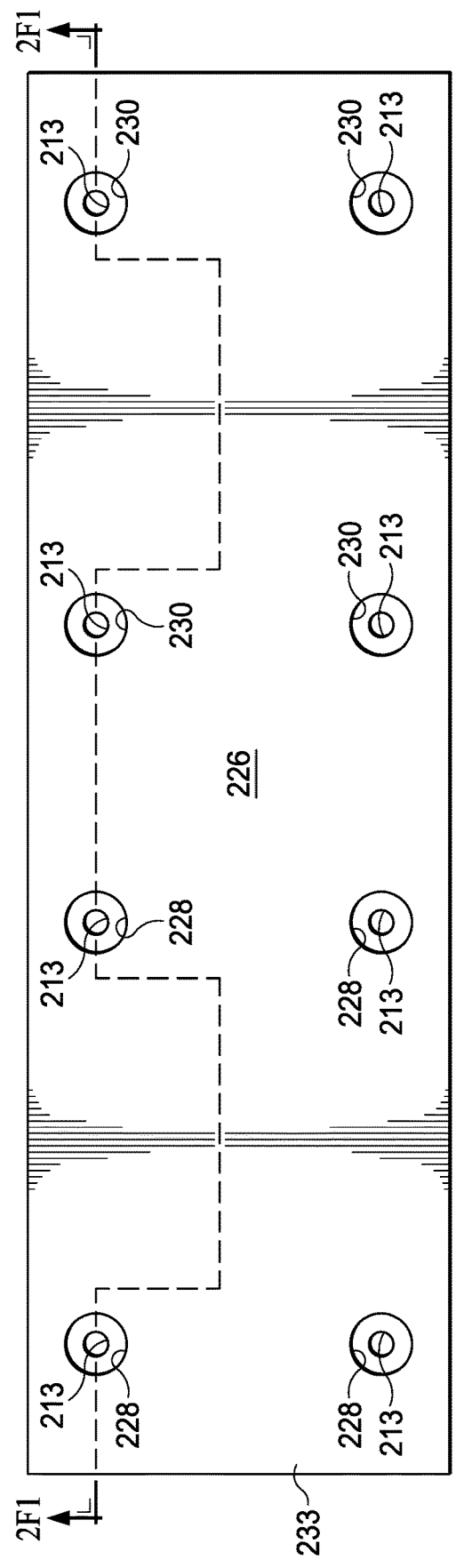
FIG. 2F2

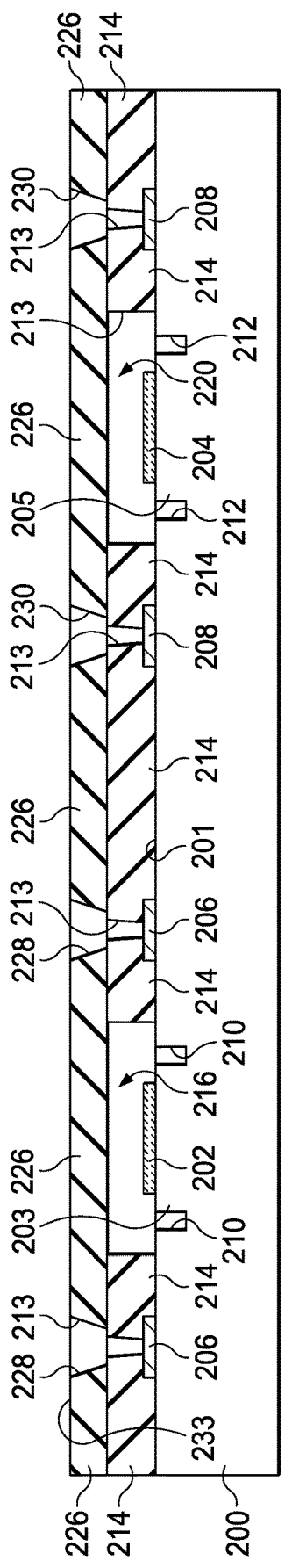
FIG. 2G1
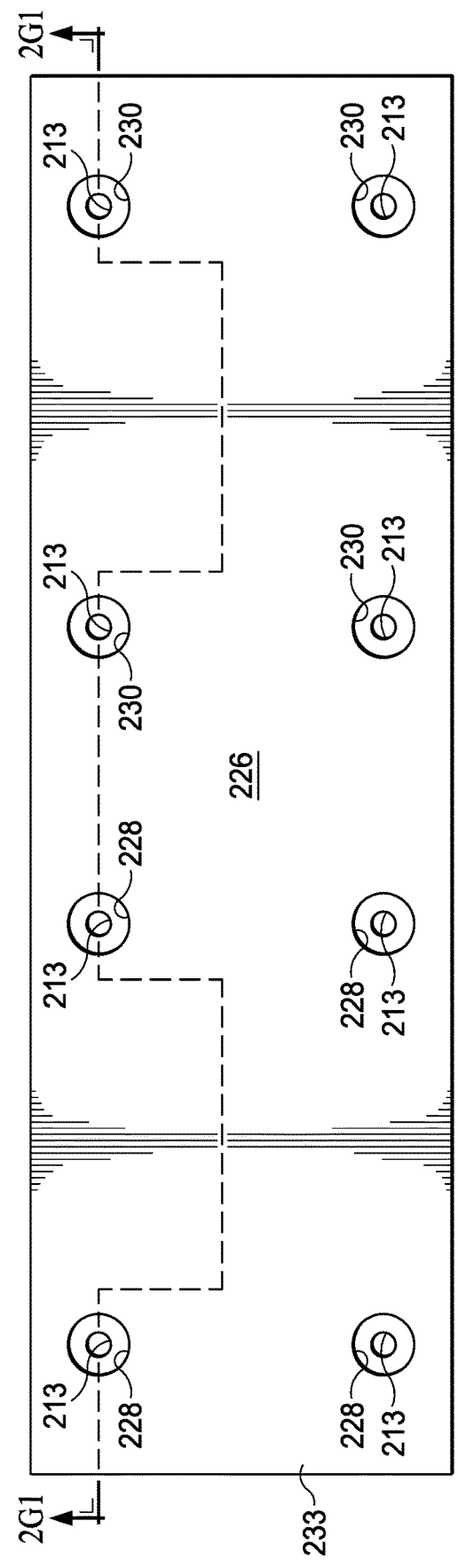
FIG. 2G2

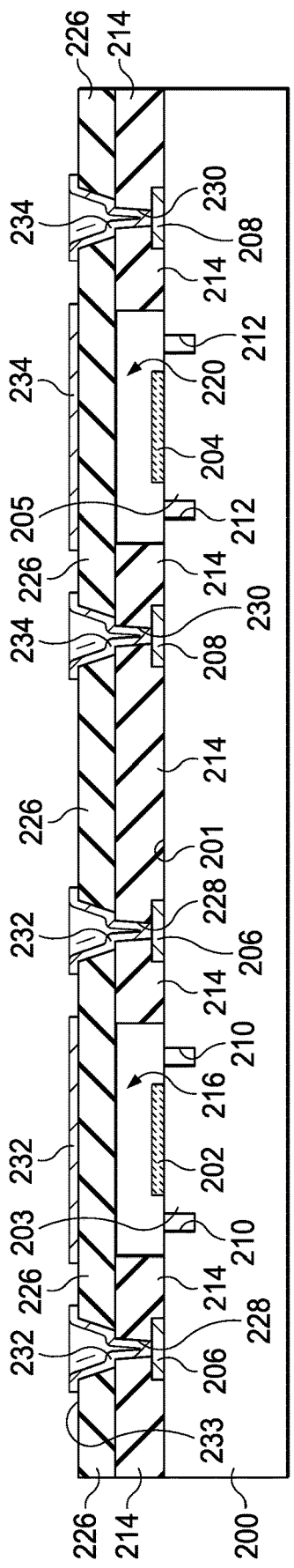
FIG. 2H1
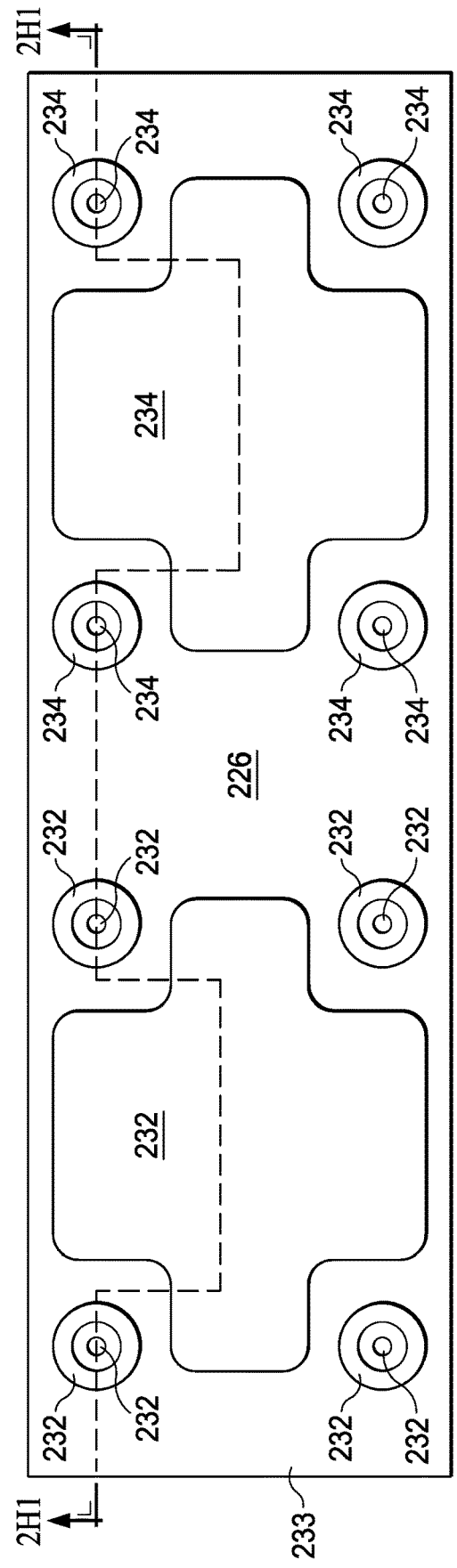
FIG. 2H2

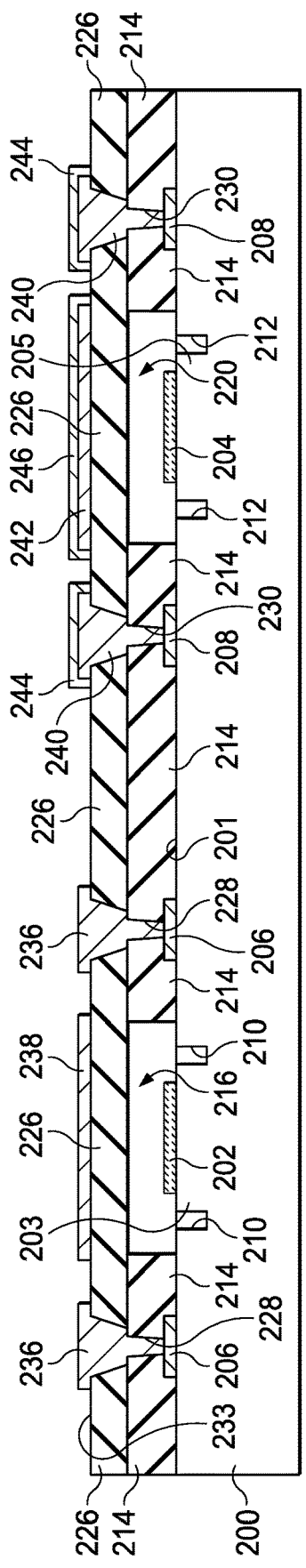
FIG. 2I1
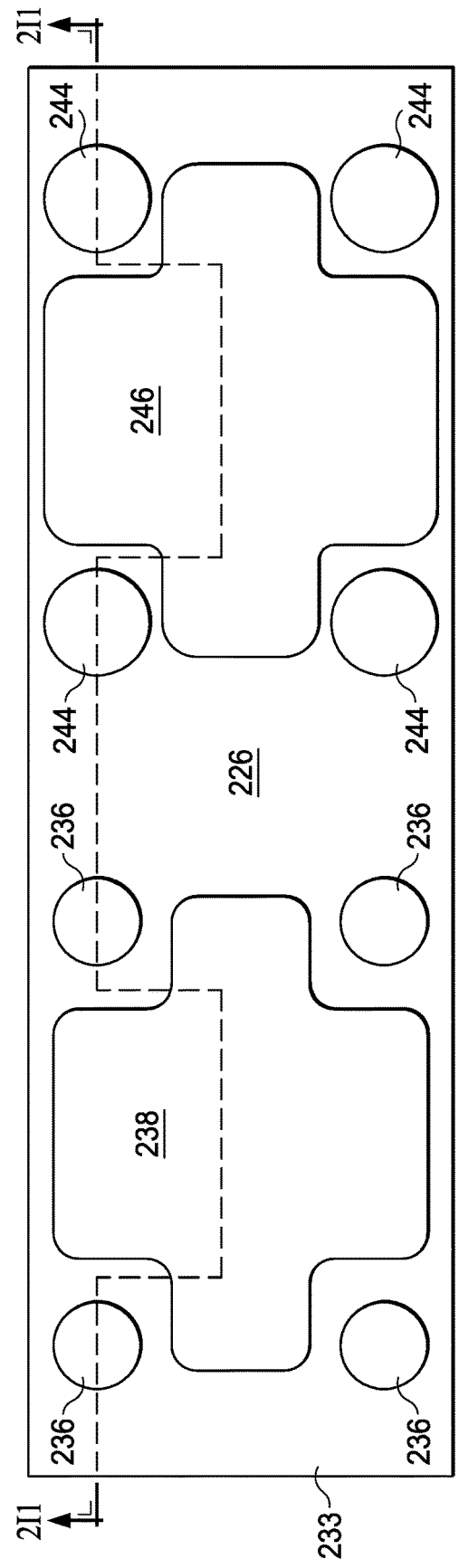
FIG. 2I2

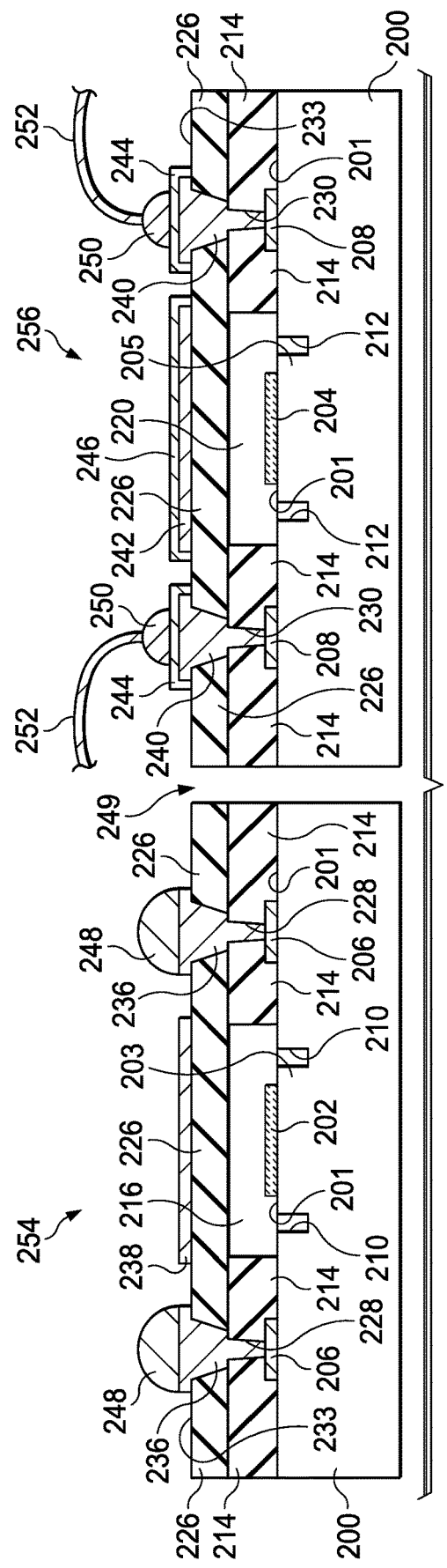
FIG. 2J1

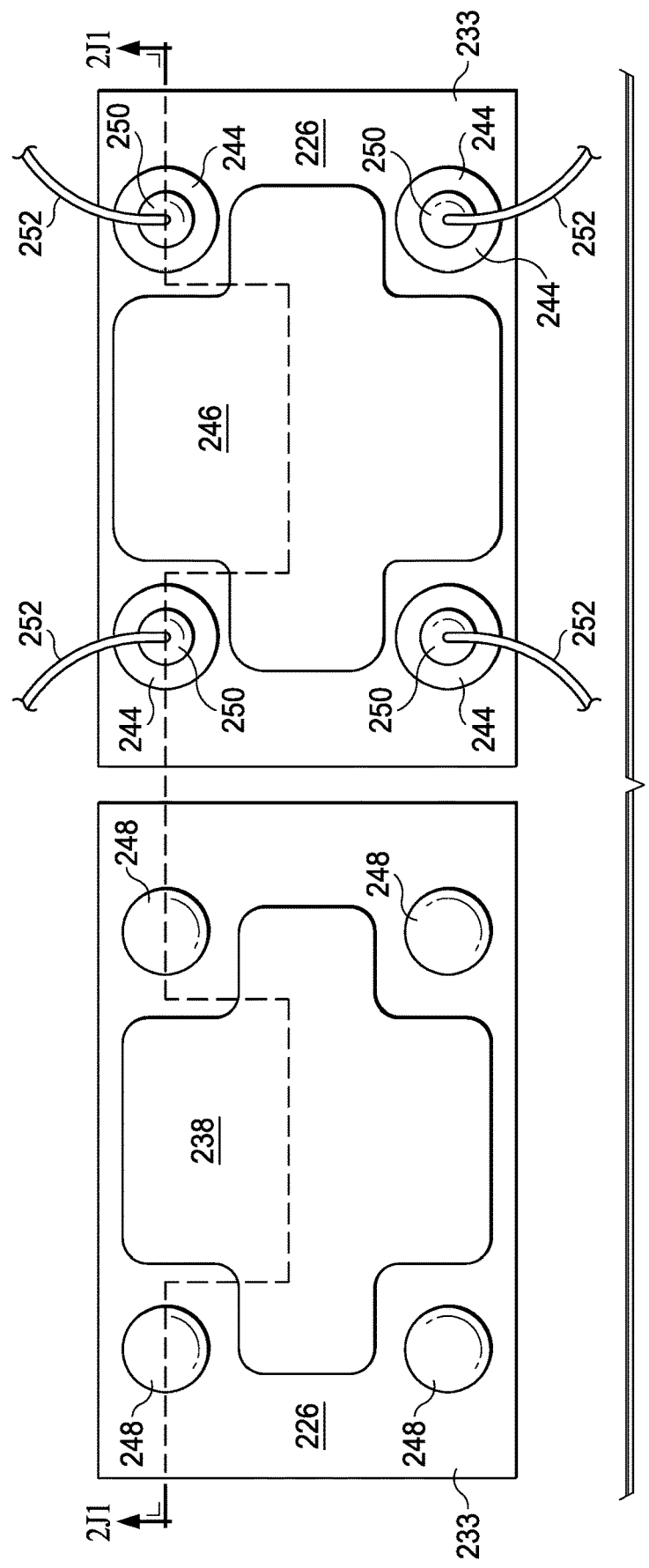
FIG. 2J2

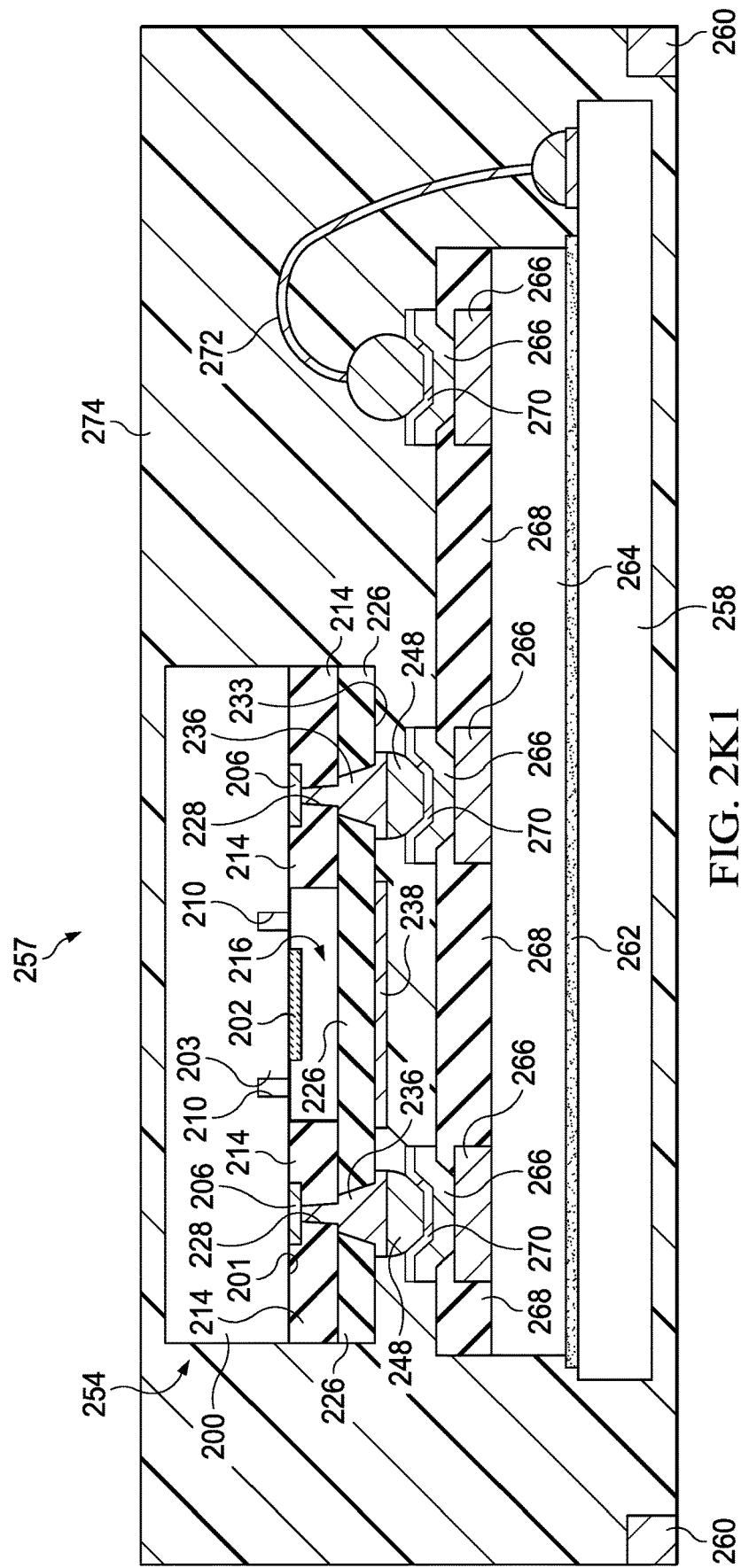
FIG. 2K1

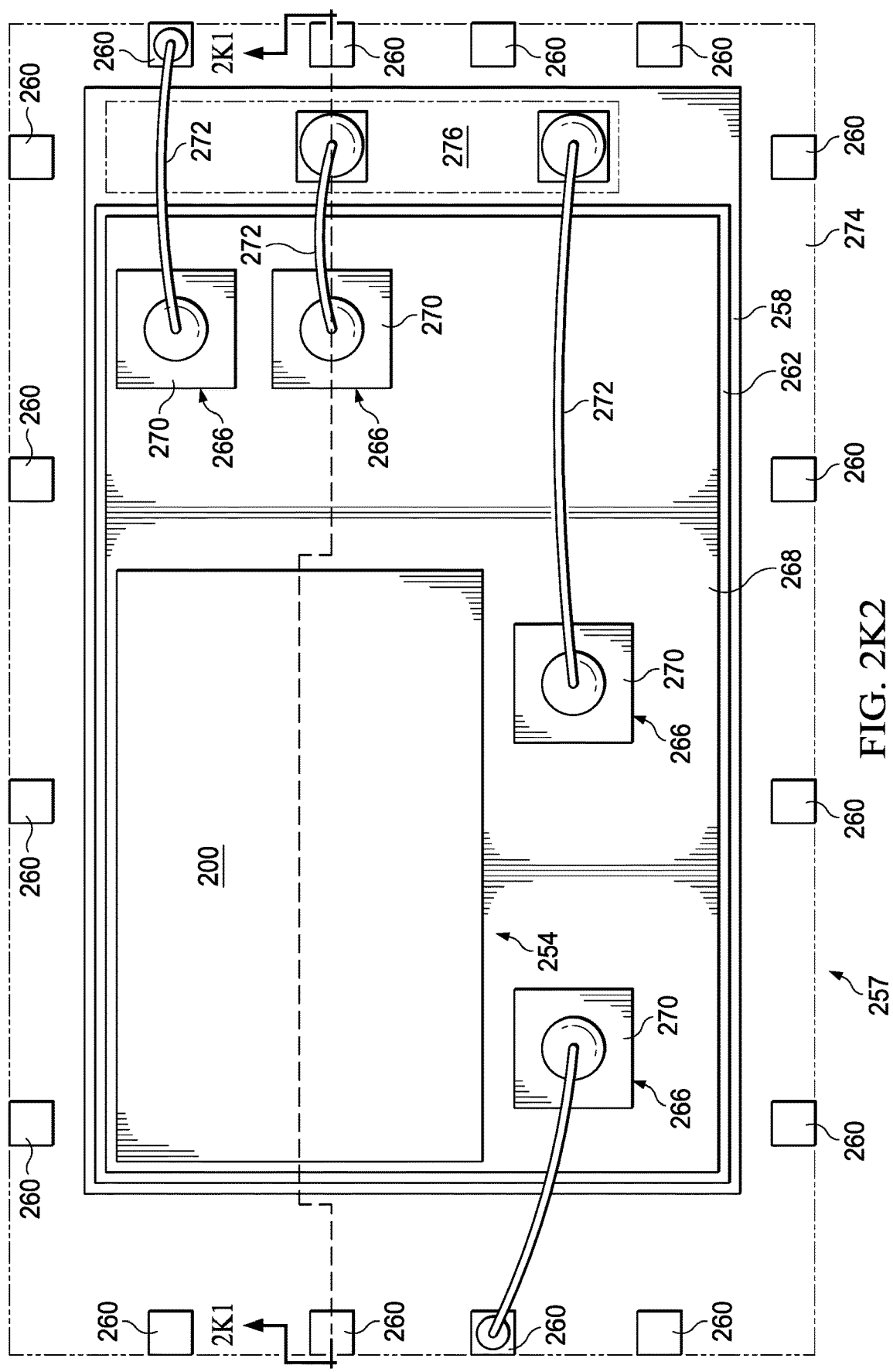
FIG. 2K2

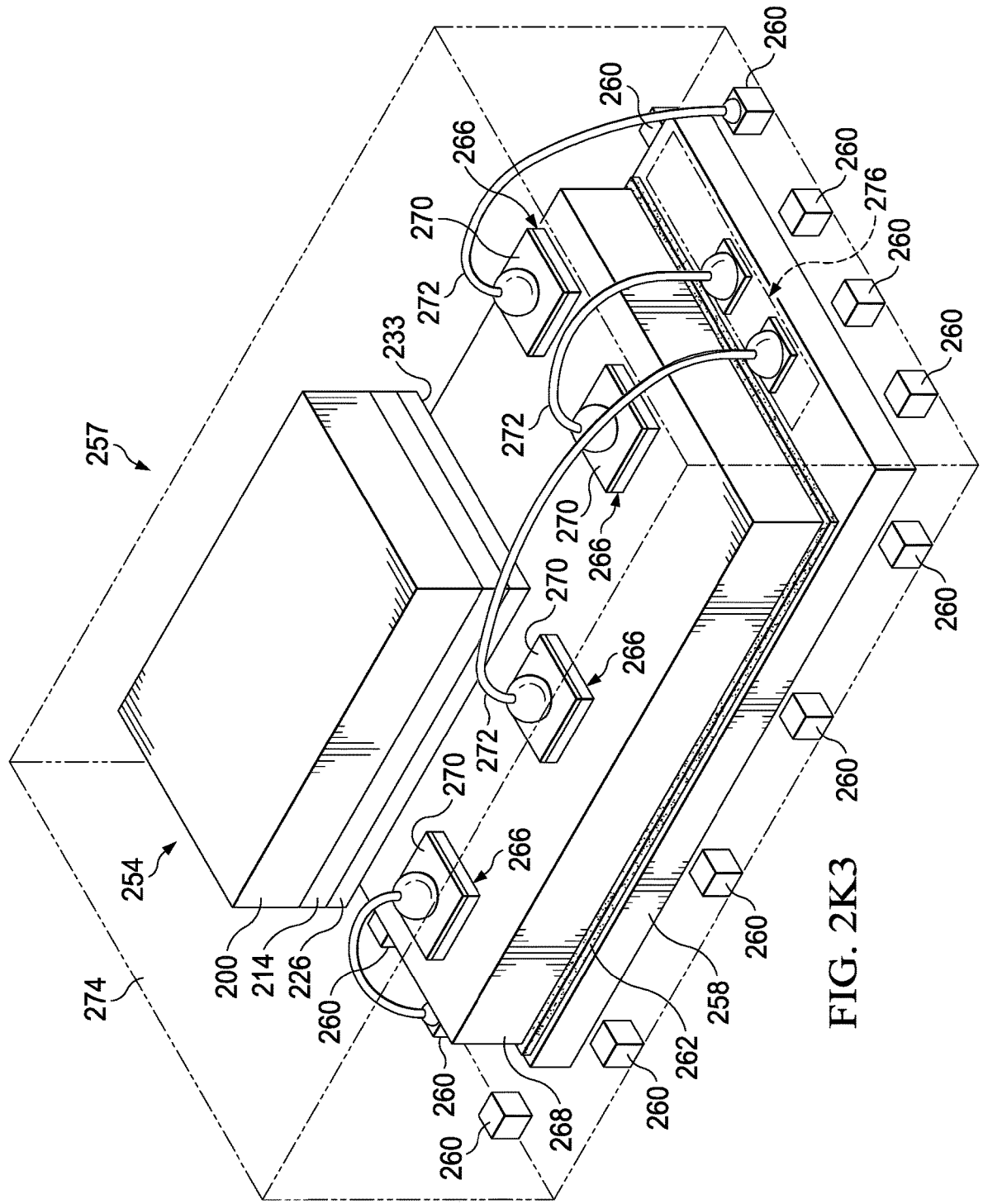
FIG. 2K3

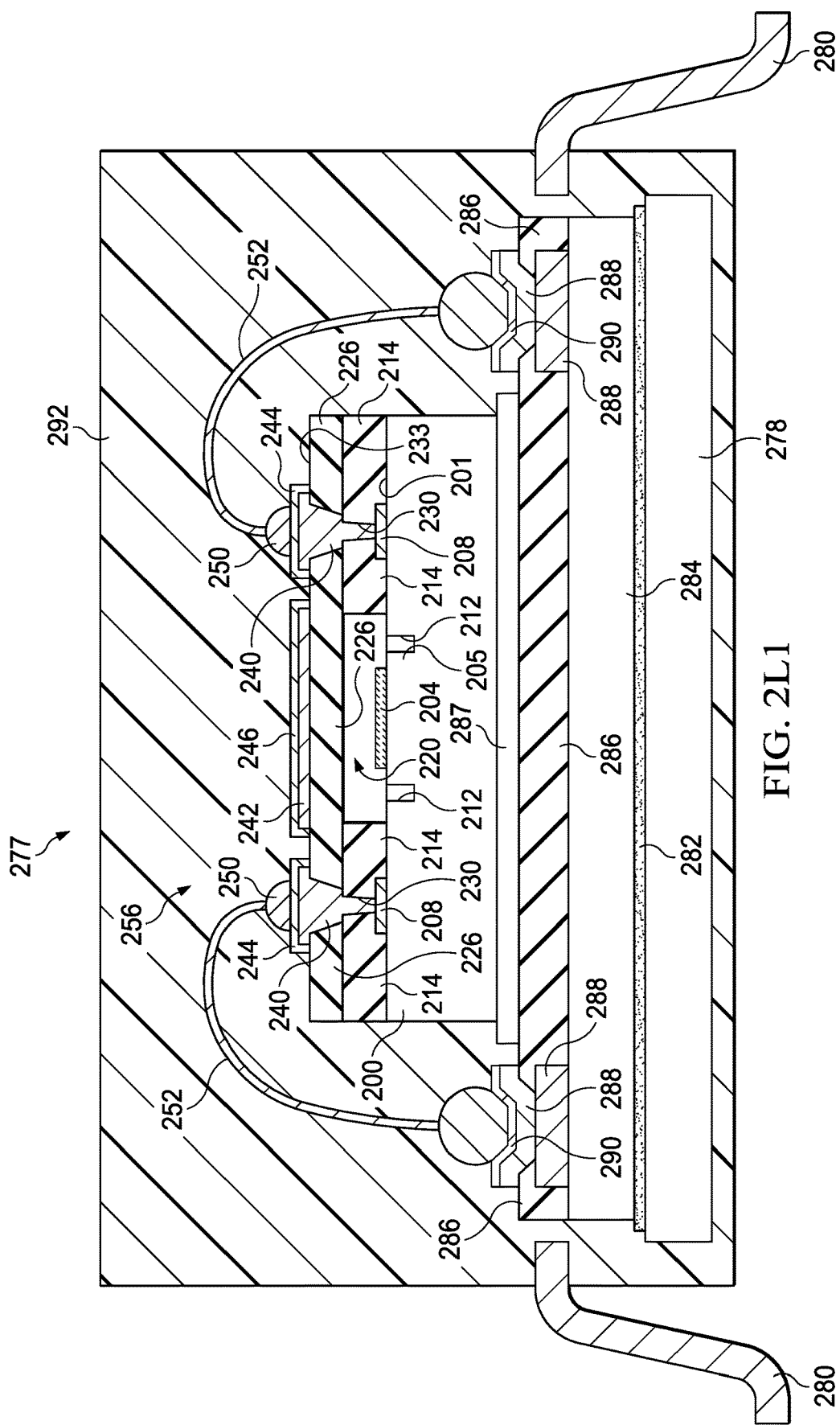
FIG. 2L1

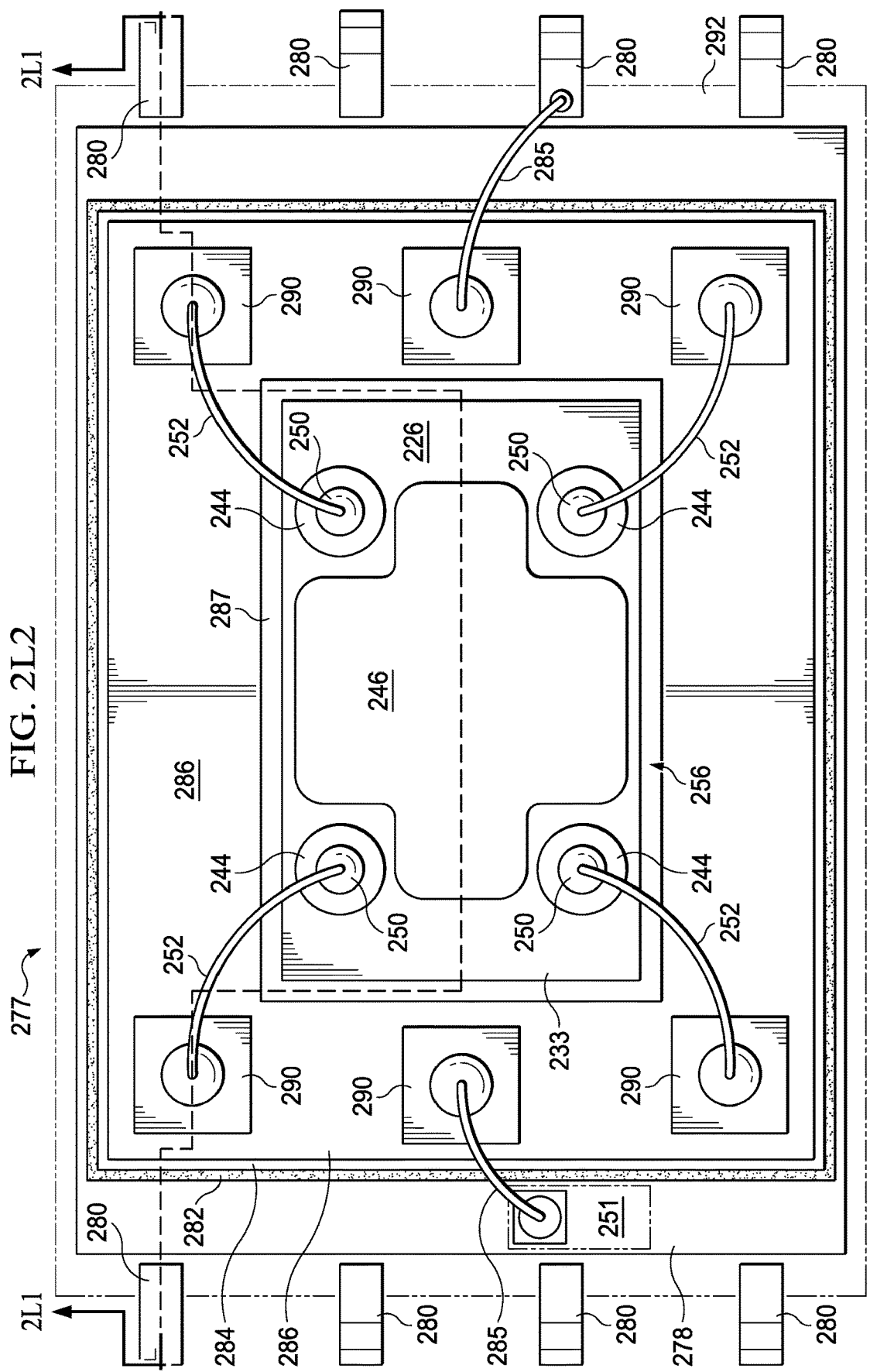
FIG. 2L2

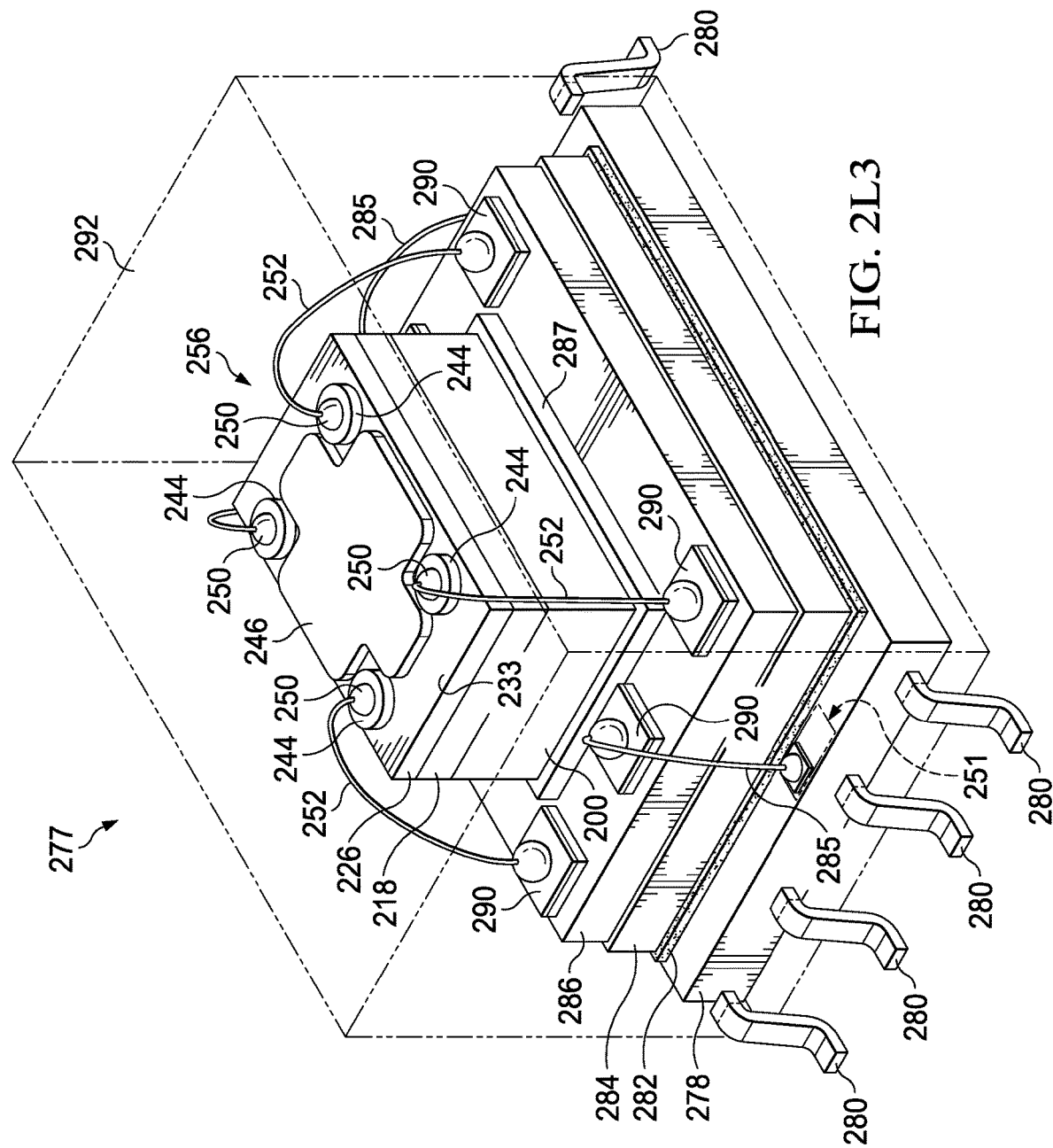
FIG. 2L3

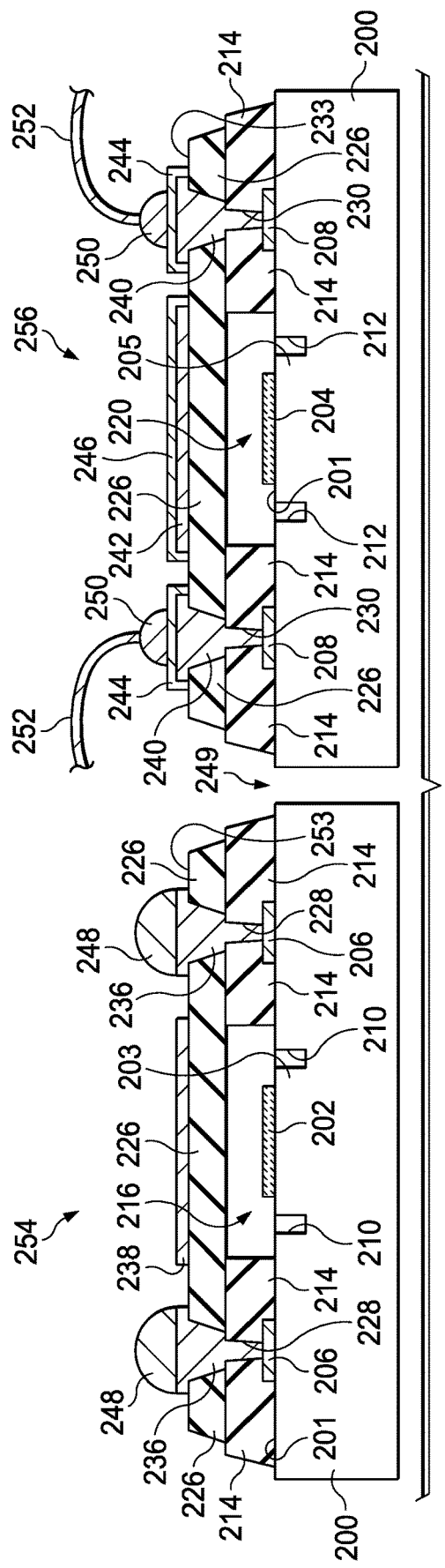
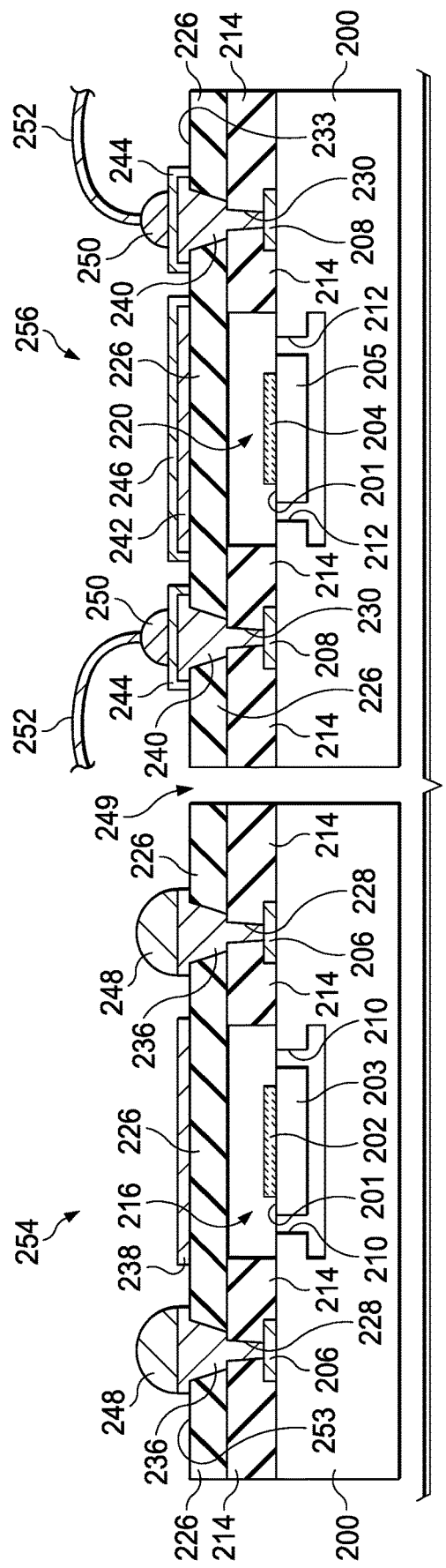
FIG. 4A
FIG. 4B

METAL RIBS IN ELECTROMECHANICAL DEVICES

This application is a continuation of patent application Ser. No. 17/002,357, filed Aug. 25, 2020, the contents of which are herein incorporated by reference in its entirety.

BACKGROUND

Electromechanical devices, such as bulk acoustic wave (BAW) and micro-electro-mechanical system (MEMS) devices, are often used to generate signals with desired frequency characteristics for use in a wide range of electronic devices. For example, such electromechanical devices may be implemented in smartphones, WiFi devices, BLUETOOTH®-enabled devices, and so on.

SUMMARY

In examples, a device comprises a semiconductor die, a thin-film layer, and an air cavity positioned between the semiconductor die and the thin-film layer. The air cavity comprises a resonator positioned on the semiconductor die. A rib couples to a surface of the thin-film layer opposite the air cavity.

BRIEF DESCRIPTION OF THE DRAWINGS

For a detailed description of various examples, reference will now be made to the accompanying drawings in which:

FIGS. 2A1-2L1, 2A2-2L2, 2K3, and 2L3 depict profile cross-sectional, top-down, and perspective views of a process flow for manufacturing an electromechanical device having a metal rib to protect an air cavity of the device, in accordance with various examples.

FIGS. 4A and 4B depict profile cross-sectional electromechanical device configurations in accordance with various examples.

DETAILED DESCRIPTION

As explained above, electromechanical devices, such as BAW and MEMS devices, can generate signals with desired frequency characteristics for use in a variety of electronic devices. In many cases, such devices include a resonator positioned on a semiconductor die, and this resonator is controlled by circuitry on the semiconductor die so that the resonator can produce a signal at the desired frequency. During the manufacturing process, a mold compound is applied to the semiconductor die, including the circuitry and the resonator, so that the circuitry and the resonator may be protected from deleterious environmental influences, such as moisture, heat, and physical trauma. The mold compound, however, introduces a mismatch in coefficients of thermal expansion (CTE), and the resulting stresses negatively impact the integrity of the circuitry and/or resonator as well as the function of the circuitry and/or resonator. To mitigate these stresses, glob tops are applied to the fragile active surface of the semiconductor die. However, such glob tops add manufacturing time and expense, increase the semiconductor die area and package size, and are incompatible with flip-chip configurations.

This disclosure describes various examples of electromechanical devices that overcome the challenges presented by the aforementioned CTE mismatches, but without the use of glob tops. Specifically, the electromechanical devices disclosed herein include a semiconductor die with first and second insulative layers (e.g., polymer thin-film layers) stacked on the semiconductor die. The insulative layers are stacked on the semiconductor die in a configuration that results in the formation of an air cavity. The air cavity includes a trench formed in the semiconductor die and partially circumscribing a platform formed in the semiconductor die, as well as a hollow area above the platform and below the first insulative layer. A resonator is positioned on the platform in the air cavity. A metal rib is positioned on a surface of the first insulative layer that is opposite the air cavity. In examples, the metal rib is a continuous member and has a surface with an area that matches or exceeds the area of the platform surface on which the resonator is positioned. The insulative layers and air cavity protect the resonator and other circuitry on the semiconductor die from the aforementioned CTE-induced stresses, and the metal rib reinforces the structural integrity of the first insulative layer so that the first insulative layer does not collapse when a mold compound is applied to cover the semiconductor die and insulative layers. As a result of these features, the resonator and other semiconductor die circuitry are protected from the consequences of CTE mismatch, and the disadvantages associated with glob top use—increased manufacturing time and expense, increased semiconductor die area and package size, and incompatibility with flip-chip configurations—are mitigated or eliminated.

Figure 1:
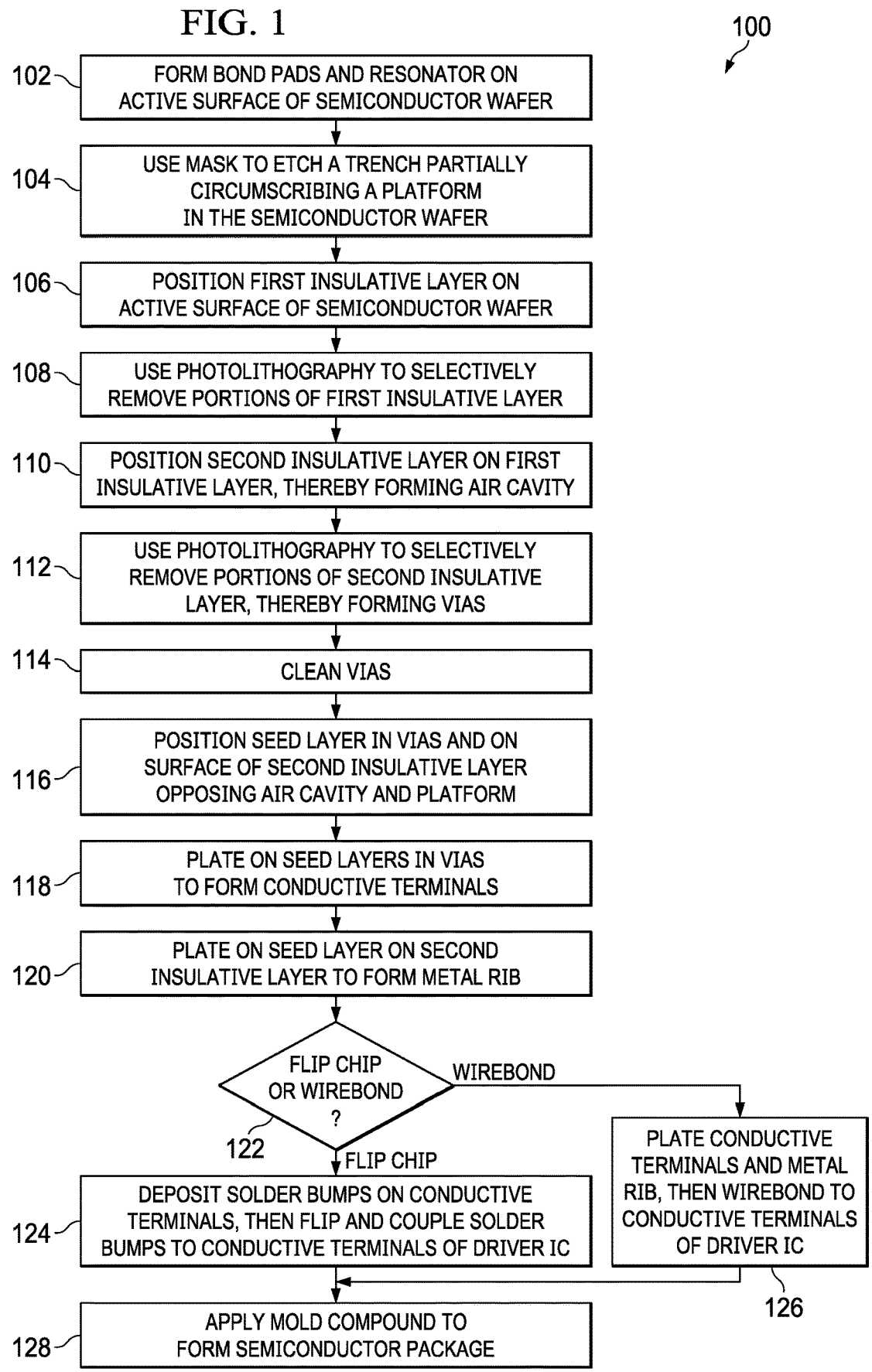
FIG. 1 depicts a flow diagram of a process for manufacturing an electromechanical device having a metal rib to protect an air cavity of the device, in accordance with various examples.

FIG. 1 depicts a flow diagram of a method 100 for manufacturing an electromechanical device having a metal rib to protect an air cavity of the device, in accordance with various examples. FIGS. 2A1-2L1, 2A2-2L2, 2K3, and 2L3 depict profile cross-sectional, top-down, and perspective views of a process flow for manufacturing an electromechanical device having a metal rib to protect an air cavity of the device, in accordance with various examples. Accordingly, FIG. 1 and FIGS. 2A1-2L1, 2A2-2L2, 2K3, and 2L3 are now described in parallel.

The method 100 begins forming bond pads and a resonator on an active surface of a semiconductor wafer (102). FIG. 2A1 depicts a profile view of a semiconductor wafer 200, for example, a silicon wafer. The semiconductor wafer 200 has an active surface 201. Resonators 202, 204 are positioned on the active surface 201. In examples, the resonators 202, 204 are piezoelectric elements positioned between a pair of electrodes. Such a resonator configuration may be suitable, for instance, in BAW and MEMS devices. Other types of resonators are contemplated and included in the scope of this disclosure. Although two resonators 202, 204 are depicted in FIG. 2A1 for the sake of clarity and simplicity, in examples, the semiconductor wafer 200 may have hundreds or thousands of resonators positioned on the active surface 201. The resonators 202, 204 may couple to circuitry (not expressly shown) on the active surface 201 that may be configured to stimulate the resonators 202, 204 to produce desired signals at desired frequencies.

FIG. 2A1 also depicts multiple bond pads 206 arranged on the active surface 201 near the resonator 202 and multiple bond pads 208 arranged on the active surface 201 near the resonator 204. The bond pads 206, 208 couple to circuitry on the active surface 201. FIG. 2A2 provides a top-down view of the structures of FIG. 2A1.

The method 100 then comprises using a mask to etch a trench partially circumscribing a platform in the semiconductor wafer (104). A suitably-patterned mask may be used in tandem with a wet or dry etch process to form the trench. For example, FIG. 2B1 is a profile, cross-sectional view that depicts a trench 210 formed in the semiconductor wafer 200. In examples, the trench 210 is a single, continuous trench that partially and horizontally circumscribes a platform 203, formed in the semiconductor wafer 200, on which the resonator 202 is positioned. FIG. 2B1 also depicts a trench 212 formed in the semiconductor wafer 200. In examples, the trench 212 is a single, continuous trench that partially and horizontally circumscribes a platform 205, formed in the semiconductor wafer 200, on which the resonator 204 is positioned. In some examples, each of the trenches 210, 212 has a depth ranging from 2 microns to 350 microns. The depths of the trenches 210, 212 is not a mere design choice; rather, deeper trenches may be advantageous because they produce a more effective stress decoupling, and shallower trenches may be advantageous because they reduce manufacturing costs. In examples, each of the trenches 210, 212 has a width ranging from 1 micron to 150 microns. The widths of the trenches 210, 212 is not a mere design choice; rather, wider trenches may be advantageous because they provide greater process flexibility (e.g., a greater margin for error during manufacture), and narrower trenches may be advantageous because they may be more suitable for smaller devices in which they are positioned. In some examples, each of the trenches 210, 212 has a total length ranging from 50 microns to 10 mm. The lengths of the trenches 210, 212 is not a mere design choice, rather, longer trenches may be advantageous because they are better able to accommodate larger resonators, and shorter trenches may be advantageous because they can efficiently accommodate smaller resonators. FIG. 2B2 depicts a top-down view of the structures of FIG. 2B1.

The method 100 subsequently comprises positioning a first insulative layer on an active surface of the semiconductor wafer (106). FIG. 2C1 depicts an insulative layer 214 positioned on the active surface 201 and abutting the resonators 202, 204, the platforms 203, 205, and the bond pads 206, 208. In examples, the insulative layer 214 comprises a polymer thin-film (e.g., polyimide, SUB, silicone, polybenzoxazole. A thin-film layer, as used herein, is a material (e.g., polymer material) with a thickness ranging from 1 micron to 100 microns and having a glass transition temperature of at least 100 degrees Celsius. In examples, the insulative layer 214 has a thickness ranging from 1 micron to 100 microns. The thickness of the insulative layer 214 is not a mere design choice; for example, a thicker insulation layer 214 may be advantageous because it may result in a more voluminous air cavity to protect a resonator, while a thinner insulative layer 214 may be advantageous because it may result in a thinner profile device. In examples, the insulative layer 214 may be deposited on the active surface 201 by, e.g., stencil print, screen print, laminate, spin coat, etc. FIG. 2C2 depicts a top-down view of the structures shown in FIG. 2C1.

The method 100 next comprises using photolithography to selectively remove portions of the first insulative layer (108). For example, although not expressly depicted, a mask may be used to expose the portions of the insulative layer 214 targeted for removal, and these portions may subsequently be developed and removed. FIG. 2D1 depicts the resulting form of the insulative layer 214, in which portions have been removed to produce orifices 213. FIG. 2D2 depicts a top-down view of the structures of FIG. 2D1.

The method 100 then includes positioning a second insulative layer on the first insulative layer, thereby forming an air cavity (110). FIG. 2E1 depicts an insulative layer 226 positioned on the insulative layer 214. In examples, the insulative layer 226 comprises a polymer thin-film. In examples, the insulative layer 226 has a thickness ranging from 1 micron to 100 microns. The thickness of the insulative layer 226 is not a mere design choice; rather, a thicker insulative layer 226 may have advantages such as those described above for the insulative layer 214, while a thinner insulative layer 226 may have advantages such as those described above for the insulative layer 214. In examples, the insulative layer 226 is deposited using a dry film lamination technique. A dry film lamination technique is used so that the insulative layer 226 does not enter the air cavities 216, 220 and instead allows the air cavities 216, 220 to maintain their volumes. In addition, in examples, the insulative layer 226 has a thickness of 10 microns or more, so that the insulative layer 226 maintains structural integrity (e.g., does not break or collapse) during manufacture. FIG. 2E2 depicts a top-down view of the structures of FIG. 2E1.

Still referring to FIG. 2E1, positioning the insulative layer 226 as shown results in the formation of air cavities 216, 220. The air cavity 216 comprises the trench 210, the platform 203, and the resonator 202, and is bounded by the semiconductor wafer 200 and the insulative layers 214, 226. The air cavity 220 comprises the trench 212, the platform 205, and the resonator 204, and is bounded by the semiconductor wafer 200 and the insulative layers 214, 226. In examples, each of the air cavities 216, 220 has a depth ranging from 50 microns to 10 millimeters. In examples, a volume of each air cavity 216, 220 may range from 250 microns 3 to 10 mm$^3$. The volume of each air cavity is not a mere design choice; rather, a larger air cavity 216, 220 may be advantageous because it better protects the resonators 202, 204, while a smaller air cavity 216, 220 may be advantageous because they result in a thinner profile device.

The method 100 comprises performing a photolithography process to selectively remove portions of the second insulative layer, thereby forming multiple vias (112). FIG. 2F1 depicts vias 228, 230 that may be formed by, e.g., using a suitably-patterned mask to expose and develop portions of the insulative layer 226 that are removed. In this way, the vias 228 provide access to the bond pads 206, and the vias 230 provide access to the bond pads 208. FIG. 2F2 depicts a top-down view of the structures of FIG. 2F1.

The method 100 subsequently comprises cleaning the vias (114). FIG. 2G1 depicts the cleaned vias 228, 230, which may be cleaned, for example, by plasma tetrafluoromethane or oxygen plasma, carbon dioxide laser, chemical wet processes, etc. FIG. 2G2 depicts a top-down view of the structures of FIG. 2G1.

The method 100 comprises positioning seed layers in the vias and on the surface of the second insulative layer that opposes the air cavity and the platform (116). FIG. 2H1 depicts seed layers 232 lining the vias 228 and the surface 233 of the insulative layer 226 that is opposite the air cavity 216. Similarly, FIG. 2H1 depicts seed layers 234 lining the vias 230 and the surface 233 of the insulative layer 226 that is opposite the air cavity 220. The seed layers 232, 234 may comprise any suitable metal, such as titanium, titanium nickel, etc. FIG. 2H2 depicts a top-down view of the structures of FIG. 2H1.

The method 100 then comprises plating (e.g., electroplating) on the seed layers in the vias to form conductive terminals in the vias (118). FIG. 2I1 depicts conductive terminals 236 formed in the vias 228, and conductive terminals 240 formed in the vias 230. The conductive terminals 236, 240 may comprise, e.g., copper. The method 100 also comprises plating (e.g., electroplating) on the seed layer on the second insulative layer to form a metal rib (120). FIG. 2I1 depicts a metal rib 238 positioned on the surface 233, opposite the air cavity 216 and the platform 203. The metal rib 238 provides structural support for (e.g., strengthens) the insulative layer 226 so that the insulative layer 226 does not collapse and damage or render useless the resonator 202 when a mold compound is applied during the packaging process. In examples, the metal rib 238 comprises copper, although other materials also may be used, such as copper; copper with a nickel plating layer; copper with nickel and palladium plating layers; copper with nickel and gold plating layers, etc. In examples, the metal rib 238 has a length that ranges from 100 microns to 10 mm, a width that ranges from 100 microns to 10 mm, and a thickness that ranges from 1 micron to 100 microns. The length and width of the metal rib 238 form an area of the metal rib 238 that may be sufficiently large to cover the underlying air cavity when viewed from a top-down orientation. This area is not a mere design choice; rather, a larger area may be advantageous because it helps preserve the integrity of larger air cavities, while a smaller area may be advantageous because it facilitates a smaller device size. In examples, this area (e.g., of a horizontal surface of the metal rib 238) is equal to or greater than an area of the surface (e.g., horizontal surface) of the platform 203 on which the resonator 202 is positioned. The thickness of the metal rib 238 is not a mere design choice; rather, a thicker metal rib 238 may be advantageous because it provides stronger support for larger air cavities, while a thinner metal rib 238 may be advantageous because it produces a thinner profile device. In examples, the metal rib 238 has a stiffness ranging of at least 1 KN/m. In examples, the metal rib 238 has a stiffness of at least 120 KN/m. In examples, the metal rib 238 has a stiffness of at least 6 MN/m. The stiffness of the metal rib 238 is not a mere design choice; rather, a stiffer metal rib 238 may be advantageous because it prevents deflection (e.g., a bend) of the metal rib 238. Bends in the metal rib 238 result in poorer support for the underlying air cavity, poorer protection for the resonator in the air cavity.

In examples, the metal rib 238 has six surfaces. In examples, the metal rib 238 has fourteen surfaces. In examples, the metal rib 238 has between six and fourteen surfaces. The number of surfaces for the metal rib 238 is not a mere design choice, as differing numbers of surfaces may produce different rib geometries, and different rib geometries may affect the ability of the metal rib 238 to support the insulative layer 226. In examples, the metal rib 238 covers 100% of the underlying air cavity when viewed from a top-down perspective. In examples, the metal rib 238 covers at least 90% of the underlying air cavity when viewed from a top-down perspective. In examples, the metal rib 238 is a continuous member, meaning that the metal rib 238 does not contain discontinuities (e.g., gaps, holes, slits, openings) that impact its ability to provide structural support for the insulative layer 226. FIG. 2I1 also depicts a metal rib 242. Except for the fact that the metal rib 242 is formed on the surface 233 opposite the air cavity 220 and the platform 205, the above description of the metal rib 238 also applies to the metal rib 242. FIG. 2I2 provides a top-down view of the structures of FIG. 2I1.

Referring again to the method 100, in the event that a flip-chip application is contemplated (122), the method 100 comprises depositing solder bumps on conductive terminals, then flipping and coupling the solder bumps to the conductive terminals of a driver integrated circuit (IC) (124). However, in the event that a wirebond application is contemplated (122), the method 100 comprises plating the conductive terminals 240 and metal rib 242 with plating layers 244 and 246 (e.g., nickel, nickel palladium, nickel palladium gold, respectively, as shown in FIGS. 2I1 and 2I2, and then wirebonding the conductive terminals to the driver IC (126). In either case, a mold compound is then applied to form a semiconductor package (128).

FIG. 2J1 depicts the structure of FIG. 2I1 sawn at numeral 249, and solder bumps 248 deposited on the conductive terminals 236 as shown to form an electromechanical device 254. FIG. 2J1 also depicts wirebond bumps 250 positioned on the conductive terminals 240 (and, more specifically, on the plating layers 244), with bond wires 252 coupled to the wirebond bumps 250, to form an electromechanical device 256. FIG. 2J2 depicts a top-down view of the structures of FIG. 2J1.

FIG. 2K1 depicts the electromechanical device 254 flipped and coupled to a driver IC. Specifically, FIG. 2K1 depicts a semiconductor package 257 comprising a mold compound 274 that covers a die pad 258 and conductive terminals 260; a die attach layer 262 coupled to the die pad 258; a semiconductor die 264 (e.g., having a driver IC that drives the electromechanical device 254); a polyimide layer 268; a redistribution layer (RDL) comprising conductive terminals 266 (e.g., copper terminals) with plating layers 270 (e.g., nickel, nickel palladium, nickel palladium gold) that couple to the active surface of the die 264; and the electromechanical device 254 that couples to the plating layers 270 via the reflowed solder bumps 248. The semiconductor package 257 also comprises a bond wire 272 that couples one of the conductive terminals 266 (and more specifically, the corresponding plating layer 270) to a surface of the die pad 258 for coupling to, e.g., other circuitry that may be positioned on the die pad 258. When the mold compound 274 is applied (e.g., via injection), the metal rib 238 prevents the insulative layer 226 from collapsing, thus preserving the structural and functional integrity of the air cavity 216 and the resonator 202. FIG. 2K2 depicts a top-down view of the structures of FIG. 2K1. Multiple conductive terminals 266 with plating layers 270 are shown in and on the polyimide layer 268, with some coupling to conductive terminals 260 via bond wires 272 and with others coupling to circuitry 276 on or coupled to the die pad 258 via bond wires 272. Referring to FIGS. 2K1 and 2K2, in operation, the driver IC formed on the semiconductor die 264 (which, in FIG. 2K2, is hidden from view by the polyimide layer 268) controls the resonator 202 via the reflowed solder bumps 248 and the conductive terminals 266. The driver IC, in turn, communicates with other circuitry via bond wires 272. FIG. 2K3 depicts a perspective view of the structures of FIGS. 2K1 and 2K2.

FIG. 2L1 depicts the electromechanical device 256 coupled to a driver IC in a wirebond application. Specifically, FIG. 2L1 depicts a semiconductor package 277 comprising a mold compound 292 covering a die pad 278; portions of conductive terminals 280; a die attach layer 282 coupled to the die pad 278; a semiconductor die 284 (e.g., having a driver IC for driving the electromechanical device 256) coupled to the die attach layer 282; a polyimide layer 286 coupled to the semiconductor die 284; conductive terminals 288 (e.g., copper) having plating layers 290 (e.g., nickel, nickel palladium, nickel palladium gold); an adhesive layer 287 coupled to the polyimide layer 286; and the electromechanical device 256 coupled to the adhesive layer 287. Bond wires 252 couple the conductive terminals 240 of the electromechanical device 256 to the conductive terminals 288 (and, more specifically, to the plating layers 290). When the mold compound 292 is applied (e.g., injected), the metal rib 242 (with plating layer 246) prevents collapse of the insulative layer 226, thereby preserving the structural and functional integrity of the air cavity 220 and the resonator 204. FIG. 2L2 depicts a top-down view of the structures of FIG. 2L1. As shown, wirebond bumps 250 couple to plating layers 290 of conductive terminals 288 via bond wires 252. Plating layers 290 also couple to circuitry 251 on or coupled to the die pad 278 via bond wires 285 and to conductive terminals 280 via bond wires 285, as shown. Referring to FIGS. 2L1 and 2L2, in operation, the driver IC on the semiconductor die 284 controls the resonator 204 via conductive terminals 288 and bond wires 252. The driver IC, in turn, communicates with other circuitry via bond wires 285 that couple to the circuitry 251 and/or to conductive terminals 280. FIG. 2L3 depicts a perspective view of the structures of FIGS. 2L1 and 2L2.

Figure 3A:
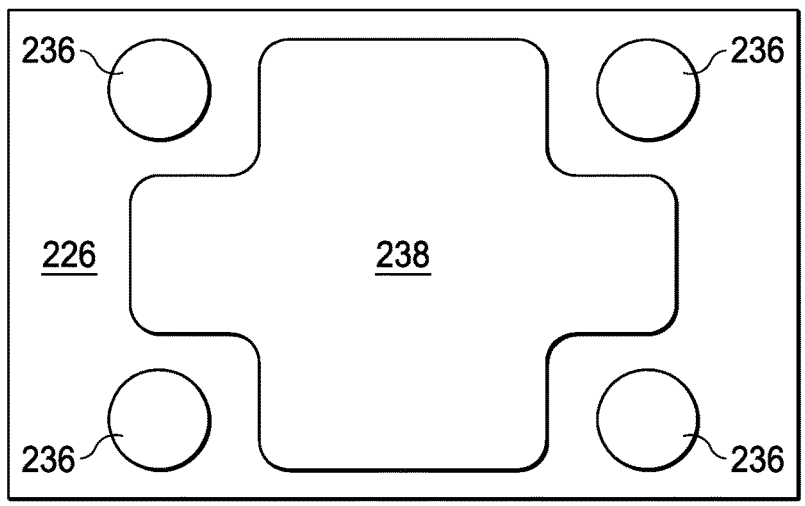
FIGS. 3A-3C depict top-down views of metal rib configurations in accordance with various examples.
Figure 3B:
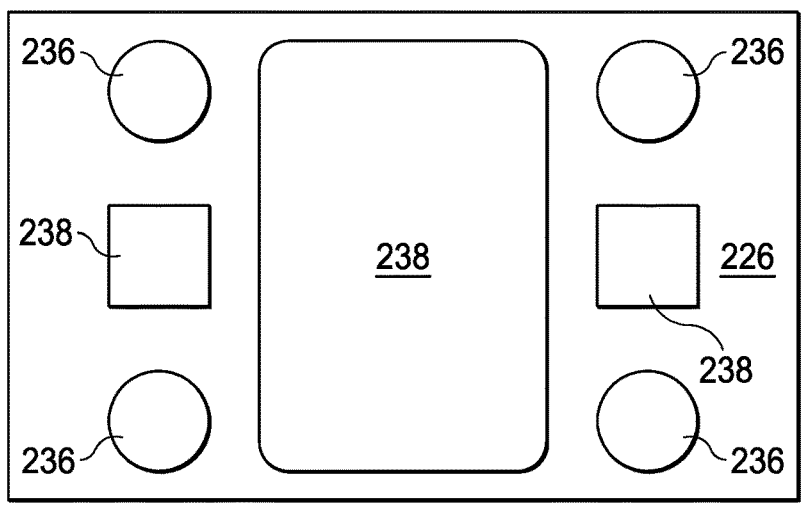
Figure 3C:
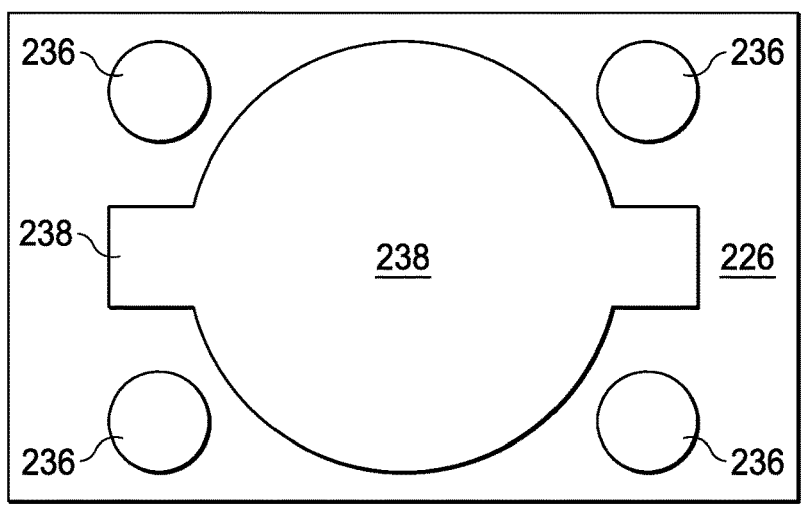

FIGS. 3A-3C depict top-down views of metal rib configurations in accordance with various examples. FIG. 3A depicts a metal rib 238 with a first configuration having fourteen surfaces and a freeform shape. More or fewer surfaces may be used, as desired. The metal rib 242, described above, may be similarly shaped and/or sized. FIG. 3B depicts a metal rib 238 with a second configuration having six surfaces and a rectangular shape. More or fewer surfaces may be used, as desired. The metal rib 238 in the example of FIG. 3B is distributed, meaning that three separate components form the metal rib 238 in the example of FIG. 3B. In examples, the smaller components of the metal rib 238 may be omitted. The metal rib 242 may be similarly shaped and/or sized. FIG. 3C depicts a metal rib 238 having a circular shape with rectangular components. The metal rib 242 may be similarly shaped and/or sized. Various metal rib shapes and sizes are contemplated beyond those expressly depicted herein. Metal ribs of all shapes and sizes that are able to increase the structural integrity of an insulative layer to which they couple are contemplated and included in the scope of this disclosure.

FIGS. 4A and 4B depict different electromechanical device configurations in accordance with various examples. In FIG. 4A, the ends of the singulated insulative layers 214, 226 are stepped. This stepped feature facilitates more accurate and efficient singulation (e.g., mechanical sawing). The stepped features may be formed, for example, using a photolithography process with suitably-patterned masks prior to singulation. In FIG. 4B, the trenches 210, 212 are formed such that the platforms 203, 205 are cantilevered platforms. A cantilevered platform is a platform that is suspended in an air cavity (e.g., air cavities 216, 220) by a single physical connection to the remainder of the semiconductor die. The top-down view of the structures of FIG. 4B is similar to that of FIG. 2B2, except that the areas underneath the platforms 203, 205 are hollow and thus the platforms 203, 205 are suspended in their respective air cavities, as FIG. 4B depicts. The cantilevered platforms 203, 205 may be formed by any suitable technique. In examples, a cavity may be formed (e.g., etched) in a first wafer, a second wafer may be coupled to the first wafer, and a perimeter may be etched around a platform in the second wafer in an area that is above the cavity of the first wafer (when viewed from a top-down configuration), such that the platform in the second wafer is cantilevered by the cavity in the first wafer and the etched perimeter in the second wafer. Advantages to a cantilevered platform include a mitigation of stress transferred through the body of the wafer(s) to the platform and/or resonator.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. Unless otherwise stated, "about," "approximately," or "substantially" preceding a value means+/−10 percent of the stated value.

The above discussion is meant to be illustrative of the principles and various examples of the present disclosure. Numerous variations and modifications will become apparent to those skilled in the art once the above disclosure is fully appreciated. It is intended that the following claims be interpreted to embrace all such variations and modifications.

What is claimed is:

1. A device, comprising:
   a semiconductor die including a resonator;
   an insulative layer;
   an air cavity positioned between the semiconductor die and the insulative layer, a portion of the resonator within the air cavity;
   a rib coupled to a surface of the insulative layer opposite the air cavity; and
   a driver semiconductor die electrically coupled to the semiconductor die.

2. The device of claim 1, wherein the rib comprises a metal rib having a thickness ranging from 1 micron to 100 microns and having a stiffness of at least 120 KN/m.

3. The device of claim 1, wherein the rib has a surface with an area matching or exceeding an area of a surface of a platform on which the resonator is positioned.

4. The device of claim 1, wherein the rib is a continuous member.

5. The device of claim 1, wherein the rib has six surfaces.

6. The device of claim 1, further comprising a conductive terminal formed in the insulative layer and coupled to an active surface of the semiconductor die.

7. The device of claim 1, wherein the insulative layer comprises a polymer having a thickness ranging from 1 micron to 100 microns.

8. The device of claim 1, wherein the insulative layer has a thickness of at least 10 microns.

9. The device of claim 1, wherein the device comprises a micro-electro-mechanical system (MEMS) device or a bulk acoustic wave (BAW) device.

10. The device of claim 1, further comprising a mold compound covering the semiconductor die, the thin-film layer, the driver semiconductor die, and the rib.

11. The device of claim 1, wherein the air cavity has a depth ranging from 50 microns to 10 millimeters.

12. The device of claim 1, wherein the semiconductor die is electrically coupled to the driver semiconductor die via a wire bond.

13. The device of claim 1, wherein the semiconductor die is electrically coupled to the driver semiconductor die via a solder bump.

14. A device, comprising:
a semiconductor die including a cantilevered platform;
a resonator on the cantilevered platform;
an insulative layer;
a trench between the semiconductor die and the insulative layer, the trench surrounding and under the cantilevered platform; and
a metal rib positioned on the insulative layer.

15. The device of claim 14, wherein the metal rib is configured to provide structural support to the insulative layer.

16. The device of claim 14, wherein the device is a micro-electro-mechanical system (MEMS) device or a bulk acoustic wave (BAW) device.

17. The device of claim 14, wherein the insulative layer comprises a polymer thin-film layer.

18. The device of claim 14, further comprising a mold compound abutting the rib and the insulative layer.

19. The device of claim 14 further comprising a second insulative layer positioned between the insulative layer and the semiconductor die.

20. The device of claim 19, further comprising a conductive terminal extending from an active surface of the semiconductor die, through the second insulative layer, and through the insulative layer.

21. The device of claim 14, wherein the platform is a cantilevered platform that is suspended in the air cavity by a portion of the semiconductor die.

22. The device of claim 14, wherein the insulative layer has a thickness ranging from 1 micron to 100 microns, and wherein the rib has a thickness ranging from 1 micron to 70 microns.

23. A device, comprising:
a first semiconductor die including a cantilevered platform;
a resonator on the cantilevered platform;
an insulative layer;
a trench between the semiconductor die and the insulative layer, the trench surrounding and under the cantilevered platform;
a metal rib positioned on the insulative layer;
a second semiconductor die electrically coupled to the first semiconductor die, the second semiconductor die below the first semiconductor die from a cross-sectional view of the device; and
a mold compound contacting portions of the first semiconductor die and the second semiconductor die.

24. The device of claim 23, wherein the first semiconductor die is electrically coupled to the second semiconductor die via a wire bond.

25. The device of claim 23, wherein the first semiconductor die is electrically coupled to the second semiconductor die via a solder bump.

26. The device of claim 23, wherein the rib is a continuous metal member having a surface with an area at least as great as an area of a surface of the platform on which the resonator is positioned.

27. The device of claim 23, wherein the first semiconductor die is a micro-electro-mechanical system (MEMS) device or a bulk acoustic wave (BAW) device.

28. The device of claim 23, wherein the second semiconductor die is a driver configured to drive the first semiconductor die.

* * * * *